(12) United States Patent
Soergel et al.

(10) Patent No.: US 10,727,560 B2
(45) Date of Patent: Jul. 28, 2020

(54) WAVEGUIDE SYSTEM, HIGH-FREQUENCY LINE AND RADAR SENSOR

(71) Applicant: Robert Bosch GmbH, Stuttgart (DE)

(72) Inventors: Werner Soergel, Pforzheim (DE); Johannes Meyer, Ettlingen (DE); Osama Khan, Sindelfingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/135,248

(22) Filed: Sep. 19, 2018

(65) Prior Publication Data

US 2019/0097292 A1 Mar. 28, 2019

(30) Foreign Application Priority Data

Sep. 25, 2017 (DE) .................. 10 2017 216 906

(51) Int. Cl.
| | |
|---|---|
| *H01P 5/02* | (2006.01) |
| *H05K 1/02* | (2006.01) |
| *G01S 7/03* | (2006.01) |
| *H01P 3/02* | (2006.01) |
| *H05K 1/14* | (2006.01) |
| *G01S 13/931* | (2020.01) |

(52) U.S. Cl.
CPC .............. *H01P 5/028* (2013.01); *G01S 7/03* (2013.01); *H01P 3/026* (2013.01); *H05K 1/0219* (2013.01); *H05K 1/0245* (2013.01); *H05K 1/145* (2013.01); *G01S 13/931* (2013.01)

(58) Field of Classification Search
CPC .. H01P 3/026; H01P 5/028; H01P 3/00; H01P 3/006; H05K 1/0245; H05K 1/0219; H05K 1/145; G01S 7/03; G01S 13/931; H01Q 1/3233; H01Q 1/50
USPC ......... 333/21 R, 26, 33, 174, 230, 246, 248, 333/255
See application file for complete search history.

(56) References Cited

U.S. PATENT DOCUMENTS

| | | | |
|---|---|---|---|
| 6,545,572 B1* | 4/2003 | Ohta ................. | H01P 5/028 333/246 |
| 2010/0134376 A1* | 6/2010 | Margomenos ....... | H01P 5/028 343/848 |

FOREIGN PATENT DOCUMENTS

DE 102007028799 A1 12/2008

\* cited by examiner

*Primary Examiner* — Rakesh B Patel
*Assistant Examiner* — Jorge L Salazar, Jr.
(74) *Attorney, Agent, or Firm* — Norton Rose Fulbright US LLP; Gerard Messina

(57) ABSTRACT

A waveguide system for a transition between a waveguide structure having an exterior stripline element and a waveguide structure having a stripline element which is completely shielded. To that end, the present invention provides a transition which is able to be realized particularly easily and efficiently with the aid of a multilayer printed circuit board architecture.

15 Claims, 4 Drawing Sheets

WAVEGUIDE SYSTEM, HIGH-FREQUENCY LINE AND RADAR SENSOR

RELATED APPLICATION INFORMATION

The present application claims priority to and the benefit of German patent application no. 10 2017 216 906.0, which was filed in Germany on Sep. 25, 2017, the disclosure which is incorporated herein by reference.

FIELD OF THE INVENTION

The present invention relates to a waveguide system for transmitting high-frequency signals, a high-frequency line as well as a radar sensor.

BACKGROUND INFORMATION

German Patent DE 10 2007 028 799 A1 discusses an impedance-controlled coplanar waveguide system for distributing high-frequency signals. It proposes to dispose a coplanar waveguide between two circuit carriers, each of which is provided with electroconductive ground conductors.

Systems for distributing high-frequency signals are utilized in numerous fields of application. Thus, for example, many devices in the consumer-electronics sector, like cell phones, for instance, include an antenna system that is connected via suitable signal lines to a high-frequency unit for processing and generating high-frequency signals. Moreover, radar sensors, as used in modern motor vehicles, for example, likewise require a high-frequency distribution network which connects the antennas with the components for generating and processing signals. In that case, various forms of the suitable high-frequency lines may be provided for conducting and distributing the high-frequency signals.

For example, microstrip line waveguides (MSW) are familiar, where a stripline is disposed above a ground plane. For further shielding, the stripline may likewise be shielded laterally with additional ground leads. Such forms are known, for example, under the term Grounded Coplanar Waveguide (GCPW). In addition, what are referred to as Buried Grounded Coplanar Waveguides (BGCPW) are also familiar, where a stripline may be shielded above and below with the aid of ground leads. In particular, for example, the stripline may be disposed between two substrates like, e.g., printed-circuit-board substrates, the sides of the substrate facing away from the stripline in each case being provided with ground planes. The two ground planes may be connected to each other by vias, for example. In this case, the transition between different high-frequency lines represents a particular challenge.

SUMMARY OF THE INVENTION

The present invention provides a waveguide system having the features described herein, a high-frequency line having the features described herein, as well as a radar system having the features described herein.

Accordingly, the following is provided:

A waveguide system having a first waveguide structure, a second waveguide structure and a transition area. The waveguide structure may be provided to transmit high-frequency signals.

The first waveguide structure includes a first electroconductive stripline element which is disposed in a first direction in space between two electroconductive planes. The second waveguide structure includes a second electroconductive stripline element which is disposed in the direction of the first direction in space above an electroconductive plane. In a second direction in space, which runs perpendicular to the first direction in space, the stripline element is surrounded by two electroconductive edge elements. The transition area of the waveguide system is located along a third direction in space, which runs perpendicular both to the first and to the second direction in space, between the first waveguide structure and the second waveguide structure. Both the first stripline element of the first waveguide structure and the second stripline element of the second waveguide structure project into the transition area. In particular, the second stripline element is situated along the first direction in space above the first stripline element.

Also provided is:

A high-frequency line having a waveguide system according to the present invention.

In addition:

A radar sensor is provided, having a signal processor, an antenna system and a waveguide system according to the present invention. The signal processor is configured to generate high-frequency signals and/or to evaluate high-frequency signals. The waveguide system is disposed between the signal processor and the antenna system. The signal processor may thereby be coupled to the antenna system via the waveguide system and possibly one or more further waveguides.

Advantages of the Invention

The present invention is based on the understanding that different forms of waveguides may be used for a distribution network of high-frequency signals. At the same time, each of the various types of waveguides may also have different advantages and disadvantages. Thus, for example, in the case of waveguides having a stripline running on a surface, it is possible to especially easily connect this stripline to further components, and in this way, to realize a connection of the waveguide. On the other hand, as a rule, waveguides having a superficially placed stripline have less shielding. In comparison, waveguide systems having an interior stripline have better shielding, such an interior waveguide usually being substantially more difficult to contact.

Therefore, an idea of the present invention is to combine the advantages of the individual types of waveguides with each other and to create a waveguide structure which provides a transition between a waveguide structure having a superficially placed stripline and a waveguide structure having a completely shielded stripline, without significant losses or disturbances occurring in so doing.

The waveguide system according to the present invention permits the transition of a waveguide having an exterior stripline to a waveguide having a stripline that is completely shielded to the outside. In this way, on one hand, a high-frequency line is able to be coupled very easily to further components like, e.g., a signal processor for generating and processing high-frequency signals or to an antenna system, the contacting in do doing being able to be realized particularly easily and therefore also inexpensively. On the other hand, the stripline for the signal conducting may be shielded completely, making it possible to keep disturbances because of radiation effects or the like particularly small.

Notably, the waveguide system according to the present invention may be realized on the basis of conventional printed circuit boards. The waveguide system may thus be realized particularly easily and cost-effectively. Moreover, construction with the aid of multilayer printed circuit boards to realize the waveguide system of the present invention permits an especially quick and also sturdy construction.

Specifically, the waveguide system having the first and second waveguide structure as well as the transition area may be realized in one shared printed circuit board architecture. For example, in so doing, the conductor patterns for the stripline elements and/or the edge elements may be realized using conventional patterning processes like, e.g., etching processes or the like.

According to one specific embodiment, in each case an electrically insulating substrate is disposed along the first direction in space between the first stripline element and the two electroconductive planes. In particular, the first stripline element may be positioned between two electrically insulating substrates, for example, with the outer sides of the substrates which face away from the stripline element in each case being provided with electroconductive planes. In addition, an electrically insulating substrate may likewise be disposed along the first direction in space between the electroconductive plane and the second stripline element as well as the two edge elements. In this case, the electrically insulating substrate has the electroconductive plane on one side, and the second stripline element, which is located between the two edge elements, runs on the side opposite this electroconductive plane. The two edge elements are thus situated on the same side as the second stripline element. For example, the electrically insulating substrates may be substrates of the type used for the formation of printed circuit boards. In particular, a special substrate as employed for printed circuit boards in the field of high-frequency engineering may be used as electrically insulating substrate.

According to one specific embodiment, the waveguide system includes joint continuous substrates for the first waveguide structure, the second waveguide structure and the transition area. In other words, electroconductive elements of the waveguide system, which viewed in the direction of the first direction in space, are in each instance disposed on identical levels, are also located on one common carrier substrate. In this way, the entire waveguide system may be realized very easily by use of a multilayer printed circuit board architecture.

According to one specific embodiment, the second stripline element has a matching element in the transition area. The matching element may be configured to match an impedance of the second waveguide structure to an impedance of the first waveguide structure. In this way, losses and reflections in the transition of the first waveguide structure to the second waveguide structure may be minimized. For instance, the matching element may be modified by varying a width of the second stripline element over a predetermined length of the matching element, in order to attain optimal matching.

According to one specific embodiment, the two electroconductive planes of the first waveguide structure are connected electrically to each other. In addition, the two electroconductive edge elements may also be connected electrically to the electroconductive plane of the second waveguide structure. The connection of the two electroconductive planes of the first waveguide structure, as well as the connection of the electroconductive edge elements to the electroconductive plane of the second waveguide structure may be realized, for example, by suitable vias, as used for the plated-through holes of printed conductors.

According to one specific embodiment, the two electroconductive planes of the first waveguide structure project into the transition area. The two electroconductive edge regions of the second waveguide structure likewise extend into the transition area. In this case, within the transition area, the two edge regions of the second waveguide structure may be connected electrically to one of the two electroconductive planes of the first waveguide structure. In this manner, the respective electroconductive plane of the first waveguide structure may change over within the transition area, into the two electroconductive edge regions of the second waveguide structure.

According to one specific embodiment, the electroconductive planes of the first waveguide structure project into the transition area, the second stripline element of the second waveguide structure being connected electrically in the transition area to one of the two planes of the first waveguide structure. In this manner, an electrical coupling may be realized between the first waveguide structure and the second waveguide structure.

Further features and advantages of specific embodiments of the invention are derived from the following description with reference to the attached drawing.

DETAILED DESCRIPTION

Figure 1:
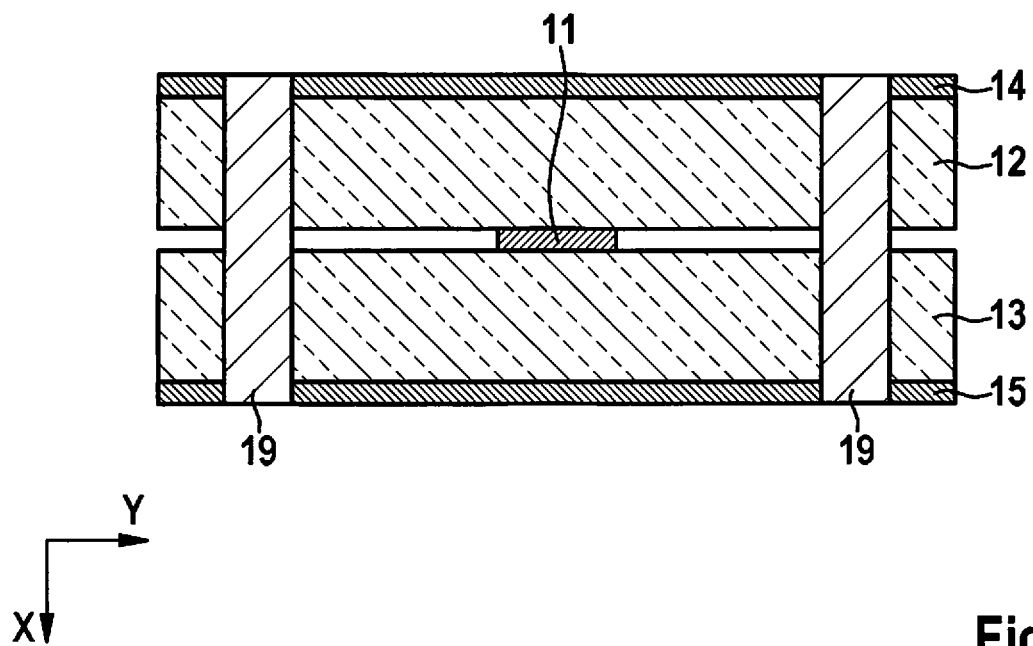
FIG. 1 shows a schematic representation of a cross-section through a first waveguide structure of a waveguide system according to one specific embodiment.

FIG. 1 shows a schematic representation of a cross-section through a waveguide structure 10. Waveguide structure 10 includes a first carrier substrate 13, on which a first stripline element 11 is disposed. On the side of first carrier substrate 13 opposite first stripline element 11, an electroconductive plane 15 is provided. For example, carrier substrate 13 together with first stripline element 11 and electroconductive plane 15 may be a printed circuit board, as used for the construction of printed circuits. In particular, printed circuit boards for the construction of printed circuits in the field of high-frequency engineering may be used. Such printed circuit boards are known under the trade name Astra MT77 or Rogers 3003, for instance. Moreover, it goes without saying that any other suitable printed circuit boards or other suitable substrates may be used, as well. On the side of first substrate 13 facing first strip element 11, a second substrate 12 is disposed. On the side of second substrate 12 facing away from first strip element 11, a further electroconductive plane 14 is provided. Analogous to first substrate 13, second substrate 12 may also be realized, for example, with the aid of a printed circuit board for a printed circuit. In this way, viewed in the first direction in space X, a construction is obtained made up of an electroconductive plane 14, second substrate 12, first stripline element 11, first substrate 13, as well as a further electroconductive plane 15. For example, the two electroconductive planes 14 and 15 may be ground planes for shielding stripline element 11. The two electroconductive planes 14 and 15 may be interconnected electrically with the aid of suitable connecting elements like, e.g., vias 19. In particular, a plurality of vias 19 may be provided in one or more rows that run parallel to stripline element 11, so that stripline element 11 may be completely shielded with the aid of the vias in connection with the two electroconductive planes 14 and 15. This construction resembles a coaxial construction. For example, such constructions are known under the name Buried Grounded Coplanar Waveguide (BGCPW). As already described previously, this construction may be realized particularly easily by use of a multilayer printed circuit board architecture.

Figure 2:
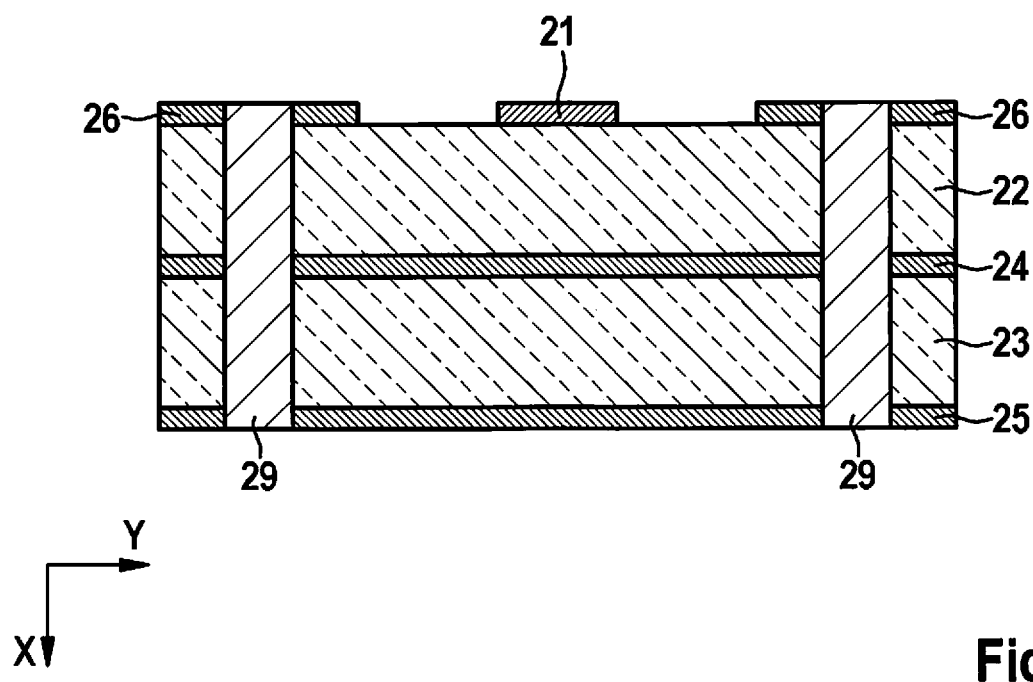
FIG. 2 shows a schematic representation of a cross-section through a second waveguide structure of a waveguide system according to one specific embodiment.

FIG. 2 shows a schematic representation of a cross-section through a second waveguide structure 20. Second waveguide structure 20 includes an electrically insulating substrate 22, on which a stripline 21 is placed on one side. Parallel to stripline 21 of second waveguide structure 20, as viewed in the Y-direction, in each case an electroconductive edge element 26 runs laterally alongside stripline element 21. An electroconductive plane 24 is provided on the side of substrate 22 opposite stripline element 21—and edge elements 26. Electroconductive plane 24 may be connected electrically to the two edge elements 26 through suitable vias 29. One or more rows of vias 29 may be provided along the course of stripline element 21 and edge elements 26 here, as well. For example, such a construction is known as a Grounded Coplanar Waveguide (GCPW).

In order, as far as possible, to match the construction of second waveguide structure 20 to the construction of first waveguide structure 10, subsequent to electroconductive plane 24 as viewed in the X-direction, a further substrate 23 may be provided as well as a further electroconductive plane 25. In this case, vias 29 are able to electrically interconnect the two electroconductive planes 24 and 25 as well as edge elements 26.

Figure 3:
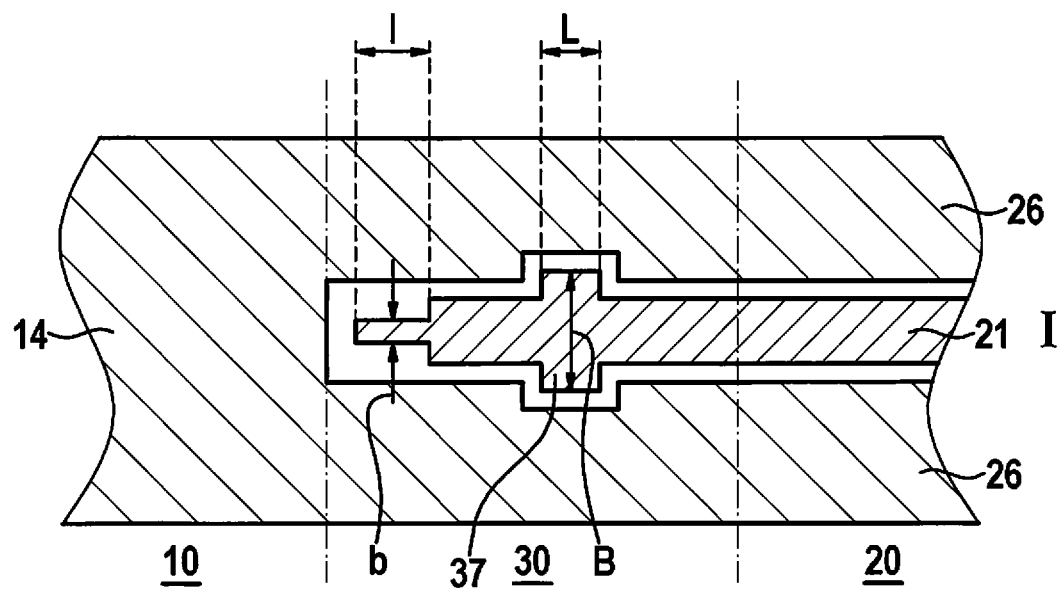
FIG. 3 shows a schematic representation of different levels of a waveguide system according to one specific embodiment.
Figure 3:
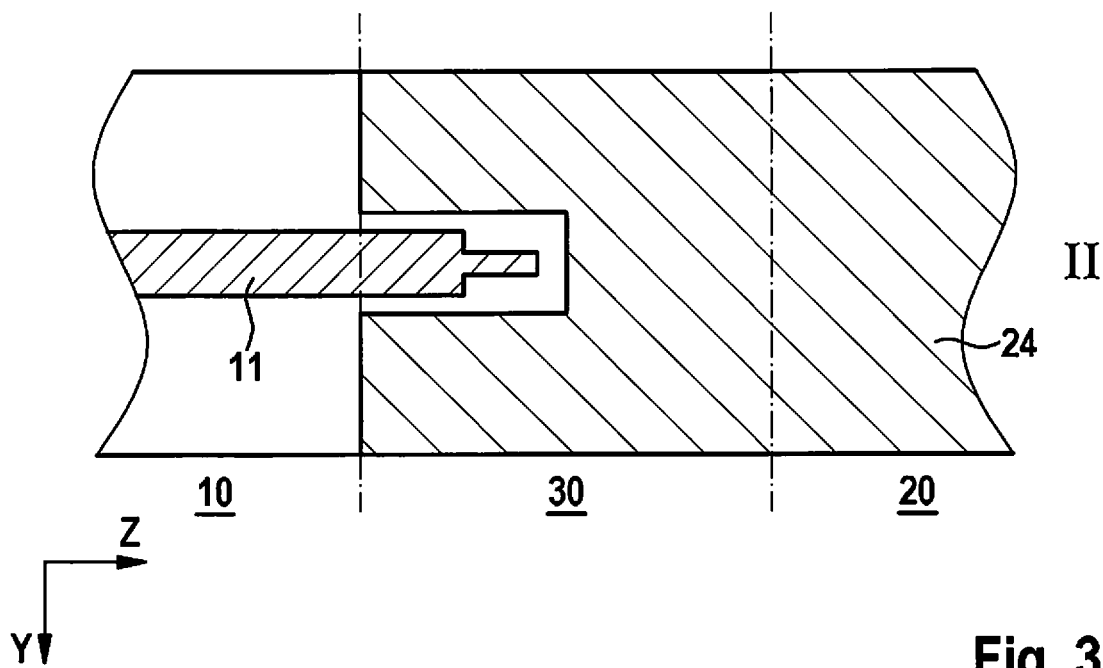

FIG. 3 shows a schematic plan view of various levels of a waveguide system according to one specific embodiment. In section I, a plan view of one level is shown which, viewed in the X-direction, includes first electroconductive plane 14 of first waveguide structure 10 and stripline 21 as well as edge elements 26 of second waveguide structure 20. As shown in FIG. 3, the waveguide system as viewed in the Z-direction includes, first of all, a first section having waveguide structure 10, followed by a transition area 30, which is thereupon followed by an area having second waveguide structure 20. In this context, first waveguide structure 10, second waveguide structure 20 and transition area 30 may be realized from shared substrates 12, 22 and 13, 23, respectively. In transition area 30, upper electroconductive plane 14 of the first waveguide structure changes over into the two edge elements 26 of second waveguide structure 20. Strip element 21 of second waveguide structure 20 is also continued in transition area 30, and thus extends into transition area 30.

In level II below that, stripline element 11 of first waveguide structure 10 likewise projects into transition area 30. As a result, viewed in the X-direction, first stripline element 11 and second stripline element 21 are situated one above the other in transition area 30. Thus, the signals are able to overcouple between the two stripline elements 11, 21. In order to match the impedances, a matching element 37 may be provided in transition area 30, e.g., on that part of stripline element 21 of second waveguide structure 20 which projects into transition area 30. In the case of this matching element 37, width B of stripline element 21 may be varied along a predetermined length L, for instance.

The electroconductive structures for stripline elements 11 and 21 of first and second waveguide structures 10, 20, as well as the necessary matching of the electroconductive regions in transition area 30 may be realized, for example, with the aid of a suitable etching process or the like for the patterning of printed circuit boards.

As a rule, electroconductive planes 15 and 25 following further in the X-direction undergo no patterning at all, so that these planes 15, 25 may be implemented full-surface. Therefore, a representation is omitted here in FIG. 3. In particular, it may be a continuous electrical plane, which is provided in transition area 30, as well. For a better overall view, vias 19 and 29, respectively, are likewise not shown.

To couple stripline element 11 of first waveguide structure 10 to stripline element 21 of second waveguide structure 20, if necessary, the ends of respective stripline elements 11, 21 may be patterned in suitable manner. For example, an area in which stripline element 11 of first waveguide structure 10 and stripline element 21 of second waveguide structure 20 overlap, may be dimensioned appropriately. For instance, the two stripline elements 11 and 21 may overlap in a range lying between 500 and 1000 µm, especially between 700 and 800 µm. Moreover, the end of stripline element 21 of second waveguide structure 20 and/or the end of first stripline element 11 of first waveguide structure 10 may also be adapted, and possibly have a predetermined length 1 and/or a predetermined width b. In addition, the distance between stripline elements 11, 21 as well as the surrounding ground areas, especially between ends 31 and 32 of stripline elements 11, 21 and the surrounding ground areas may also be adjusted accordingly. For example, a width b in end area 31 or 32 of stripline elements 11, 21 may be adjusted to as small a width as possible of, e.g., 100 µm or possibly less. Length 1 of ends 31, 32 may lie in the range of a few 100 µm, e.g., between 200 and 300 µm. Furthermore, the distance between ends 31, 32 of stripline elements 11, 21 and the surrounding metallization may be set to a lowest possible value of, e.g., 100 µm or less. Naturally, values differing from the specifications described above are also possible, depending on the application case.

Figure 4:
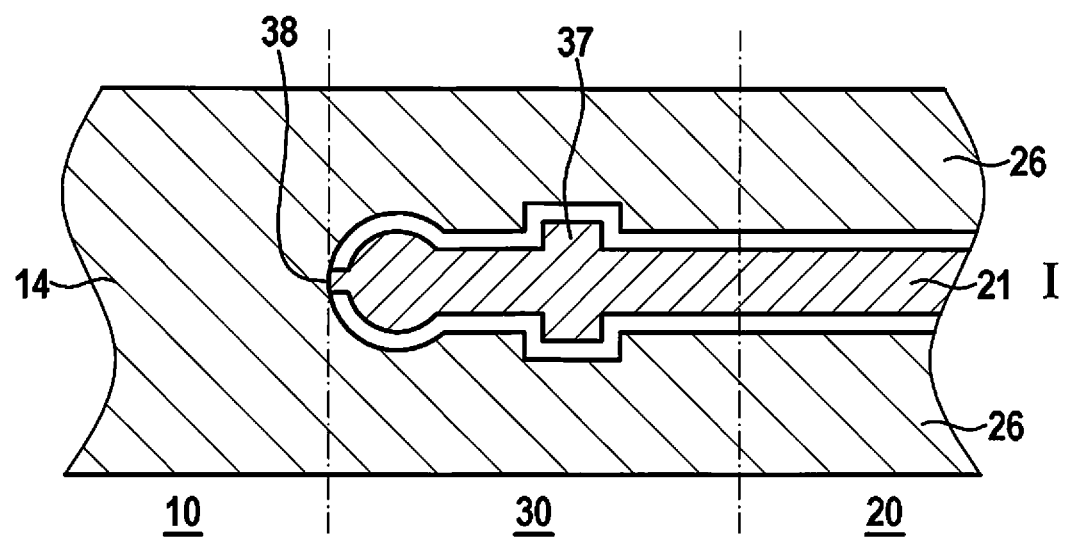
FIG. 4 shows a schematic representation of different levels of a waveguide system according to a further specific embodiment.
Figure 4:
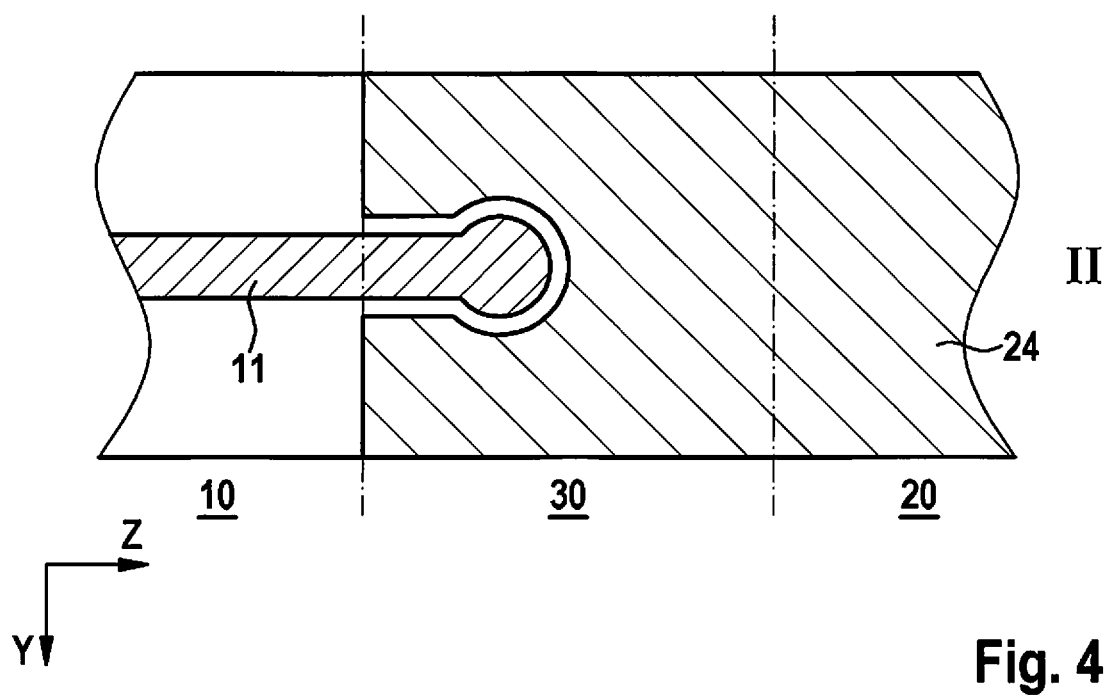

FIG. 4 shows a schematic representation of plan views of the conductor patterns of a waveguide system according to one specific embodiment. The waveguide system according to this specific embodiment corresponds essentially to the constructions described above, so that a repetition of the individual details may be omitted here. The waveguide system according to the specific embodiment in FIG. 4 differs from the preceding exemplary embodiment by the fact that in level I, in which stripline element 21 of second waveguide structure 20 is located, in transition area 30 there is an electrical contacting 38 with electroconductive plane 14 of first waveguide structure 10. Thus, a short circuit is able to be realized between stripline element 21 of the second waveguide structure and ground plane 14 of first waveguide structure 10 at this electrical connection 38. This electroconductive connection 38 at the end of stripline element 21 may be provided in transition area 30. In this way, parasitic capacitances that may develop are able to be avoided or at least minimized. For example, as shown in FIG. 4, the end of stripline element 21 in transition area 30 may be implemented as a circular pad which has as thin an electrical connection as possible to ground plane 14 of first waveguide structure 10 in transition area 30. The minimum width of electrical connection 38 may be limited, for instance, by the patterning process (etching process or the like) to be realized. For example, the width of electrical connection 38 may amount to approximately 100 µm. Also in the specific embodiment of waveguide system shown here, in the X-direction below stripline element 21 of second waveguide structure 20, stripline element 11 of first waveguide structure 10 may project into transition area 30, so that the two stripline elements 11, 21 overlap in transition area 30. For instance, the patterning of the end of stripline element 11 of first waveguide structure 10 may correspond at least approximately to a patterning of strip element 21 of second waveguide structure 20.

Figure 5:
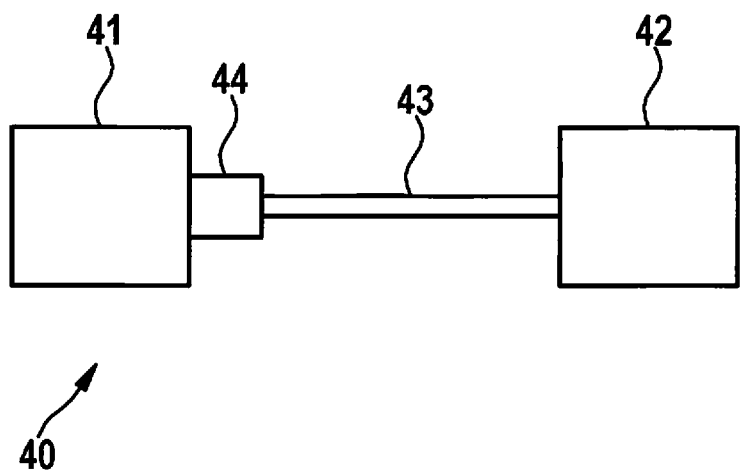
FIG. 5 shows a schematic representation of a radar system according to one specific embodiment.

FIG. 5 shows a schematic representation of a radar system 40 according to one specific embodiment. Radar sensor 40 includes a signal processor 41 which, for example, is able to generate high-frequency signals that are thereupon sent out, in order to evaluate the reflections of the transmitted signals. Accordingly, signal processor 41 is also able to evaluate received high-frequency signals. In addition, radar sensor 40 may include an antenna system made up of one or more antennas, which send out generated high-frequency signals and/or receive high-frequency signals from the surroundings. Signal processor 41 and antenna system 42 may be connected to each other via a high-frequency distribution network with suitable high-frequency lines 43. For example, a previously described waveguide system 44 may be provided at the junction between signal processor 41 and high-frequency lines 43. In this way, the high-frequency signals may be transferred from the printed circuit board of signal processor 41 into high-frequency lines 43 for further distribution.

In summary, the present invention relates to a waveguide system for a transition between a waveguide structure having an exterior stripline element and a waveguide structure having a stripline element which is completely shielded. To that end, the present invention provides a transition which is able to be realized particularly easily and efficiently with the aid of a multilayer printed circuit board architecture.

What is claimed is:

1. A waveguide system, comprising:
   a first waveguide structure having a first electroconductive stripline element, which is disposed in a first direction in a space between two electroconductive planes;
   a second waveguide structure having a second electroconductive stripline element, which is disposed in the first direction in a space above a third electroconductive plane, and which in a second direction in a space, is surrounded by two electroconductive edge elements, the second direction in the space running perpendicular to the first direction in space; and
   a transition area, which is situated spatially between the first waveguide structure and the second waveguide structure, the first stripline element and the second stripline element each projecting into the transition area, and the second stripline element being situated along the first direction in a space above the first stripline element;
   wherein the two electroconductive planes of the first waveguide structure project into the transition area, and the two edge elements of the second waveguide structure project into the transition area, and within the transition area, the two edge elements of the second waveguide structure are connected electrically to and are co-planar with one of the two electroconductive planes of the first waveguide structure.

2. The waveguide system of claim 1, wherein in each case an electrically insulating substrate is disposed along the first direction in a space between the first stripline element and the two electroconductive planes, and an electrically insulating substrate is disposed along the first direction in a space between the second stripline element having the two edge elements, and the third electroconductive plane.

3. The waveguide system of claim 1, wherein the first waveguide structure and the second waveguide structure include at least one electrically insulating substrate in common.

4. The waveguide system of claim 1, wherein in the transition area, the second stripline element has a matching element which is configured to match an impedance of the second waveguide structure to an impedance of the first waveguide structure.

5. The waveguide system of claim 1, wherein the two electroconductive planes of the first waveguide structure are connected electrically to each other, and the two electroconductive edge elements and the third electroconductive plane of the second waveguide structure are connected electrically to each other.

6. The waveguide system of claim 1, wherein the first electroconductive stripline is co-planar with the third electroconductive plane of the second waveguide structure, and the second electroductive stripline is coplanar with the one of the two electroductive planes of the first waveguide structure.

7. The waveguide system of claim 1, wherein the transition area, the second stripline element is connected electrically to and is co-planar with one of the two electroconductive planes of the first waveguide structure.

8. The waveguide system of claim 1, wherein the first waveguide structure includes a buried grounded coplanar waveguide, and the second waveguide structure includes a grounded coplanar waveguide.

9. The waveguide system of claim 1, wherein the transition area is situated, in the second direction in a space, spatially between the first waveguide structure and the second waveguide structure.

10. A radar sensor, comprising:
    a signal processor to generate high-frequency signals and/or to receive and evaluate high-frequency signals;
    an antenna system; and
    a waveguide system, including:
       a first waveguide structure having a first electroconductive stripline element, which is disposed in a first direction in a space between two electroconductive planes;
       a second waveguide structure having a second electroconductive stripline element, which is disposed in the first direction in a space above a third electroconductive plane, and which in a second direction in a space, is surrounded by two electroconductive edge elements, the second direction in the space running perpendicular to the first direction in the space; and
       a transition area, which is situated spatially between the first waveguide structure and the second waveguide structure, the first stripline element and the second stripline element each projecting into the transition area, and the second stripline element being situated along the first direction in a space above the first stripline element;
       wherein the two electroconductive planes of the first waveguide structure project into the transition area, and the two edge elements of the second waveguide structure project into the transition area, and within the transition area, the two edge elements of the second waveguide structure are connected electrically to and are co-planar with one of the two electroconductive planes of the first waveguide structure; and wherein the waveguide system is coupled electrically to the signal processor and the antenna system.

11. The radar sensor of claim 10, wherein the first electroconductive stripline is co-planar with the third electroconductive plane of the second waveguide structure, and the second electroductive stripline is coplanar with the one of the two electroductive planes of the first waveguide structure.

12. The radar sensor of claim 10, wherein the transition area is situated, in the second direction in a space, spatially between the first waveguide structure and the second waveguide structure.

13. A high-frequency line, comprising:
a waveguide system, including:
a first waveguide structure having a first electroconductive stripline element, which is disposed in a first direction in a space between two electroconductive planes;
a second waveguide structure having a second electroconductive stripline element, which is disposed in the first direction in a space above a third electroconductive plane, and which in a second direction in a space, is surrounded by two electroconductive edge elements, the second direction in the space running perpendicular to the first direction in the space; and
a transition area, which is situated spatially between the first waveguide structure and the second waveguide structure, the first stripline element and the second stripline element each projecting into the transition area, and the second stripline element being situated along the first direction in a space above the first stripline element;
wherein the two electroconductive planes of the first waveguide structure project into the transition area, and the two edge elements of the second waveguide structure project into the transition area, and within the transition area, the two edge elements of the second waveguide structure are connected electrically to and are co-planar with one of the two electroconductive planes of the first waveguide structure.

14. The high-frequency line of claim 13, wherein the first electroconductive stripline is co-planar with the third electroconductive plane of the second waveguide structure, and the second electroductive stripline is coplanar with the one of the two electroductive planes of the first waveguide structure.

15. The high-frequency line of claim 13, wherein the transition area is situated, in the second direction in a space, spatially between the first waveguide structure and the second waveguide structure.

* * * * *